(12) United States Patent
Huang et al.

(10) Patent No.: US 11,630,494 B2
(45) Date of Patent: Apr. 18, 2023

(54) HOUSING STRUCTURE AND TERMINAL DEVICE

(71) Applicant: HONOR DEVICE CO., LTD., Guangdong (CN)

(72) Inventors: Hua Huang, Guangdong (CN); Jun Yang, Guangdong (CN); Zhiguo Zhang, Guangdong (CN); Haitao Zhen, Guangdong (CN)

(73) Assignee: Honor Device Co., Ltd., Shenzhen (CN)

( * ) Notice: Subject to any disclaimer, the term of this patent is extended or adjusted under 35 U.S.C. 154(b) by 148 days.

(21) Appl. No.: 17/418,646

(22) PCT Filed: Nov. 30, 2019

(86) PCT No.: PCT/CN2019/122253
§ 371 (c)(1),
(2) Date: Jun. 25, 2021

(87) PCT Pub. No.: WO2020/134871
PCT Pub. Date: Jul. 2, 2020

(65) Prior Publication Data
US 2022/0100243 A1    Mar. 31, 2022

(30) Foreign Application Priority Data
Dec. 27, 2018  (CN) .......................... 201811609128.2

(51) Int. Cl.
*G06F 1/20* (2006.01)
*G06F 1/16* (2006.01)
*H05K 7/20* (2006.01)

(52) U.S. Cl.
CPC ............ *G06F 1/203* (2013.01); *G06F 1/1624* (2013.01); *H05K 7/20972* (2013.01); *H05K 7/20981* (2013.01)

(58) Field of Classification Search
CPC ... G06F 1/203; G06F 1/1624; H05K 7/20972; H05K 7/20981
See application file for complete search history.

(56) References Cited

U.S. PATENT DOCUMENTS 6,496,369 B2   12/2002  Nakamura
6,590,768 B1    7/2003  Wiley
(Continued)

FOREIGN PATENT DOCUMENTS

CN   1342042 A     3/2002
CN   102905506 A   1/2013
(Continued)

*Primary Examiner* — Mukundbhai G Patel
(74) *Attorney, Agent, or Firm* — Leydig, Voit & Mayer, Ltd.

(57) ABSTRACT

Embodiments of this application disclose a housing structure and a terminal device. The housing structure includes a bottom shell and a lifting shell. A first end of the bottom shell is connected to a first end of the lifting shell, a second end of the bottom shell and a second end of the lifting shell are spaced by a first distance, and space between the bottom shell and the lifting shell forms a heat dissipation channel. A heat dissipation panel is disposed on the bottom shell, a first surface of the heat dissipation panel is in contact with a heat emitting component, and a second surface of the heat dissipation panel is located in the heat dissipation channel. Therefore, the housing structure provided in the embodiments of this application can better dissipate heat for the heat emitting component in the bottom shell.

14 Claims, 5 Drawing Sheets

(56) References Cited

U.S. PATENT DOCUMENTS

| | | | |
|---|---|---|---|
| 10,154,613 | B1 | 12/2018 | Lin |
| 10,359,861 | B2 * | 7/2019 | Yamada ................ G06F 1/1658 |
| 2002/0018337 | A1 | 2/2002 | Nakamura et al. |
| 2009/0101789 | A1 | 4/2009 | Chen |
| 2013/0027873 | A1 * | 1/2013 | Chen ....................... G06F 1/203 |
| | | | 361/695 |
| 2014/0188283 | A1 | 7/2014 | Ghosh et al. |
| 2015/0351269 | A1 * | 12/2015 | Huang .................... G06F 1/181 |
| | | | 174/66 |
| 2017/0045920 | A1 | 2/2017 | Armstrong et al. |
| 2019/0094918 | A1 * | 3/2019 | Lin ....................... G06F 1/1681 |
| 2022/0100243 | A1 | 3/2022 | Huang et al. |

FOREIGN PATENT DOCUMENTS

| | | |
|---|---|---|
| CN | 102929339 A | 2/2013 |
| CN | 203840687 U | 9/2014 |
| CN | 204595712 U | 8/2015 |
| CN | 206849013 U | 1/2018 |
| CN | 108644566 A | 10/2018 |
| CN | 108983926 A | 12/2018 |
| CN | 109634392 A | 4/2019 |
| JP | 2000112573 A | 4/2000 |

\* cited by examiner

HOUSING STRUCTURE AND TERMINAL DEVICE

CROSS-REFERENCE TO RELATED APPLICATIONS

This application is a National Stage of International Application No. PCT/CN2019/122253, filed on Nov. 30, 2019, which claims priority to Chinese Patent Application No. 201811609128.2, filed with the China National Intellectual Property Administration on Dec. 27, 2018 and entitled "HOUSING STRUCTURE AND TERMINAL DEVICE", which is incorporated herein by reference in its entirety.

TECHNICAL FIELD

Embodiments of this application relate to the field of terminal devices, and more specifically, to a housing structure and a terminal device.

BACKGROUND

As notebook computers develop towards high performance and lightening and thinning, heat dissipation performance has become an important factor affecting notebook computer development.

Currently, a heat dissipation structure of a notebook computer includes a heat pipe, a heat sink, and a fan. The heat pipe is in contact with heat emitting components by using a heat conducting material. For example, the heat emitting components are a central processing unit (CPU) and a graphics processing unit (GPU). The heat pipe transfers heat on the heat emitting components to the heat sink, and the fan dissipates heat on the heat sink to an external environment through an air outlet.

However, as performance of notebook computers continuously increases, power consumption of the notebook computers also increases, and heat emitting components of the notebook computers generate more heat. As a result, a conventional heat dissipation structure cannot properly dissipate heat for the heat emitting components. In this way, a surface temperature of a notebook computer is high, and this affects a hand feeling of a user. In addition, heat emitting components automatically perform underclocking, for example, a central processing unit automatically reduces a frequency, and this affects user experience of the user.

SUMMARY

Embodiments of this application provide a housing structure and a terminal device, to better dissipate heat for a heat emitting component of a notebook computer.

The embodiments of this application are implemented as follows:

According to a first aspect, an embodiment of this application provides a housing structure. The housing structure includes a bottom shell and a lifting shell. A first end of the bottom shell is connected to a first end of the lifting shell, a second end of the bottom shell and a second end of the lifting shell are spaced by a first distance, and space between the bottom shell and the lifting shell forms a heat dissipation channel. A heat dissipation panel is disposed on the bottom shell, a first surface of the heat dissipation panel is in contact with a heat emitting component, and a second surface of the heat dissipation panel is located in the heat dissipation channel.

In the first aspect, the heat dissipation panel is disposed on the bottom shell, and the first surface of the heat dissipation panel is in contact with the heat emitting component, to transfer heat generated by the heat emitting component to the heat dissipation panel. Because the second surface of the heat dissipation panel is located in the heat dissipation channel formed by the bottom shell and the lifting shell, heat on the heat dissipation panel can be quickly carried away by air in the heat dissipation channel. Because the heat dissipation channel is communicated with an external environment, heat dissipated by the heat dissipation panel quickly flows to the external environment through the heat dissipation channel. Therefore, the housing structure provided in this embodiment of this application can better dissipate heat for the heat emitting component in the bottom shell.

In a possible implementation, the housing structure further includes a sliding assembly. The first end of the bottom shell and the first end of the lifting shell are hinged, and the second end of the bottom shell is connected to the second end of the lifting shell by using the sliding assembly. When the second end of the lifting shell and the second end of the bottom shell move relative to each other by using the sliding assembly, to be spaced by the first distance, the second end of the lifting shell and the second end of the bottom shell are fixedly connected by using the sliding assembly.

When a user does not need to dissipate heat for the heat emitting component in the bottom shell, the user may enable the housing structure to be in a closed state by using the sliding assembly. In this case, no heat dissipation channel is formed between the bottom shell and the lifting shell. When the user needs to dissipate heat for the heat emitting component in the bottom shell, the user may enable the housing structure to be in an open state by using the sliding assembly. In this case, the heat dissipation channel is formed between the bottom shell and the lifting shell. Therefore, in this embodiment of this application, the housing structure may be enabled to be in the open state or the closed state by using the sliding assembly, so that the housing structure provided in this embodiment of this application has higher flexibility.

In a possible implementation, the sliding assembly includes a sliding shaft and a sliding mechanical part, the sliding shaft is disposed at the second end of the bottom shell, and the sliding mechanical part is disposed at the second end of the lifting shell. A sliding slot and a blocking slot that are connected to each other are disposed on the sliding mechanical part, and the sliding shaft adapts to the sliding slot and the blocking slot. When the sliding shaft slides in the sliding slot to the blocking slot on the sliding mechanical part, the second end of the lifting shell and the second end of the bottom shell are spaced by the first distance, and the second end of the lifting shell is fixedly connected to the second end of the bottom shell by using the sliding shaft and the blocking slot.

In a possible implementation, a groove for accommodating the lifting shell is disposed on the bottom shell.

When the user does not need to dissipate heat for the heat emitting component in the bottom shell, the user may enable the housing structure to be in the closed state by using the sliding assembly. In this case, no heat dissipation channel is formed between the bottom shell and the lifting shell, and the lifting shell may be accommodated in the groove on the bottom shell, to save space for placing the housing structure.

In a possible implementation, the first end of the bottom shell is fixedly connected to the first end of the lifting shell.

In a possible implementation, a heat conducting material and a heat pipe are further disposed on the first surface of the heat dissipation panel. The first surface of the heat dissipation panel is in contact with the heat emitting component by using the heat conducting material and the heat pipe.

Because the heat conducting material and the heat pipe have better heat conducting property, the heat conducting material and the heat pipe can better transfer heat on the heat emitting component to the heat dissipation panel, so that the heat dissipation panel can more quickly transfer heat to the external environment.

In a possible implementation, a heat dissipation fin is further disposed on the second surface of the heat dissipation panel.

In a possible implementation, a heat dissipation fan is further disposed on the heat dissipation fin on the second surface of the heat dissipation panel.

The heat dissipation fin is disposed on the second surface of the heat dissipation panel. The heat dissipation fin increases a heat dissipation area of the heat dissipation panel, and the heat dissipation fin can quickly transfer heat on the heat dissipation panel to the external environment. In addition, the heat dissipation fan can blow cold air from the external environment to the heat dissipation fin, so that heat on the heat dissipation fin is dissipated more quickly.

In a possible implementation, at least one air vent is disposed on the heat dissipation panel.

The air vent disposed on the heat dissipation panel also can quickly transfer heat on the heat dissipation panel to the external environment.

According to a second aspect, an embodiment of this application provides a terminal device. The terminal device includes the housing structure disclosed in any one of the first aspect and the possible implementations of the first aspect.

DESCRIPTION OF EMBODIMENTS

The following describes the technical solutions in the embodiments of this application with reference to the accompanying drawings in the embodiments of this application.

Figure 1:
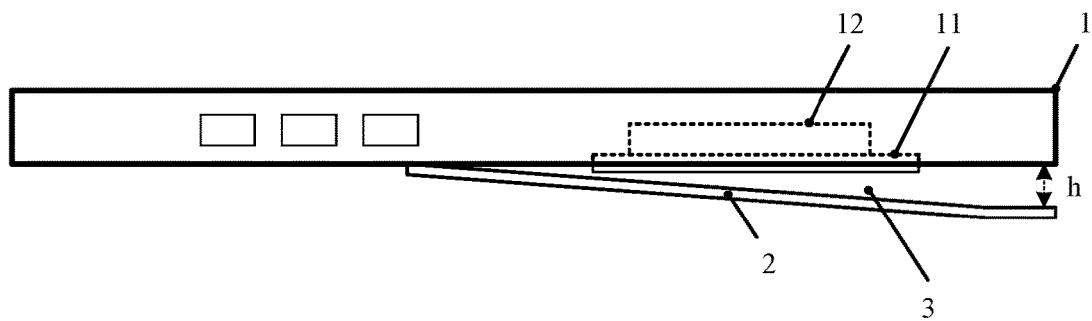
FIG. 1 is a schematic diagram of a housing structure according to an embodiment of this application.

FIG. 1 is a schematic diagram of a housing structure according to an embodiment of this application. The housing structure in FIG. 1 may be a housing structure of a notebook computer. In the embodiment shown in FIG. 1, the housing structure includes a bottom shell 1 and a lifting shell 2. A first end of the bottom shell 1 is connected to a first end of the lifting shell 2, a second end of the bottom shell 1 and a second end of the lifting shell 2 are spaced by a first distance h, and space between the bottom shell 1 and the lifting shell 2 forms a heat dissipation channel 3. A heat dissipation panel 11 is disposed on the bottom shell 1, a first surface of the heat dissipation panel 11 is in contact with a heat emitting component 12, and a second surface of the heat dissipation panel 11 is located in the heat dissipation channel 3. The heat emitting component 12 may be a component inside the notebook computer, for example, a central processing unit or a graphics processing unit.

In the embodiment shown in FIG. 1, the heat dissipation panel 11 is disposed on the bottom shell 1, and the first surface of the heat dissipation panel 11 is in contact with the heat emitting component 12, to transfer heat generated by the heat emitting component 12 to the heat dissipation panel 11. Because the second surface of the heat dissipation panel 11 is located in the heat dissipation channel 3 formed by the bottom shell 1 and the lifting shell 2, heat on the heat dissipation panel 11 can be quickly carried away by air in the heat dissipation channel 3. Because the heat dissipation channel 3 is communicated with an external environment, heat dissipated by the heat dissipation panel 11 quickly flows to the external environment through the heat dissipation channel 3. Therefore, the housing structure provided in this embodiment of this application can better dissipate heat for the heat emitting component 12 in the bottom shell 1.

Figure 2:
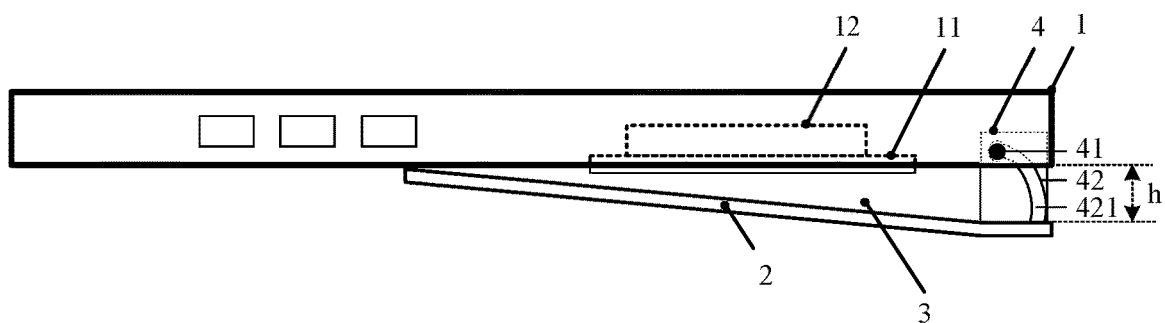
FIG. 2 is a schematic diagram of a housing structure in an open state according to an embodiment of this application.
Figure 3:
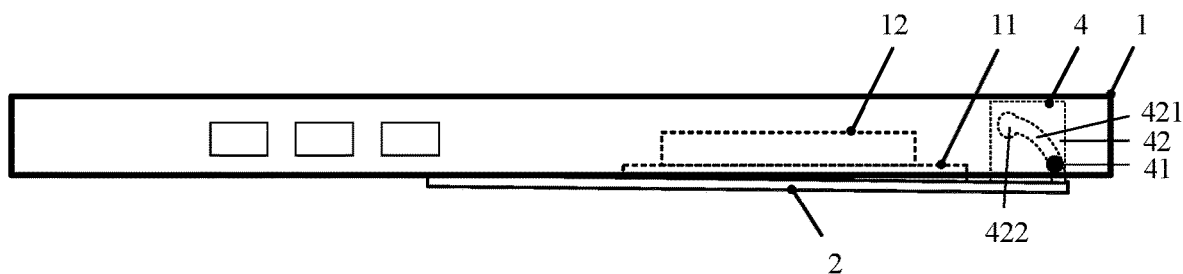
FIG. 3 is a schematic diagram of a housing structure in a closed state according to an embodiment of this application.

FIG. 2 is a schematic diagram of the housing structure in an open state according to an embodiment of this application, and FIG. 3 is a schematic diagram of the housing structure in a closed state according to an embodiment of this application. In the embodiments shown in FIG. 2 and FIG. 3, in addition to all the parts in FIG. 1, the housing structure further includes a sliding assembly 4. The first end of the bottom shell 1 and the first end of the lifting shell 2 are hinged, and the second end of the bottom shell 1 is connected to the second end of the lifting shell 2 by using the sliding assembly 4. When the second end of the lifting shell 2 and the second end of the bottom shell 1 move relative to each other by using the sliding assembly 4, to be spaced by the first distance h, the second end of the lifting shell 2 and the second end of the bottom shell 1 are fixedly connected by using the sliding assembly 4, as shown by the state in FIG. 2. In other words, the housing structure is in the open state. The second end of the lifting shell 2 and the second end of the bottom shell 1 may move relative to each other by using the sliding assembly 4, to be in contact with each other, as shown by the state in FIG. 3. In other words, the housing structure is in the closed state.

In the embodiments shown in FIG. 2 and FIG. 3, when a user does not need to dissipate heat for the heat emitting component 12 in the bottom shell 1, the user may enable the housing structure to be in the closed state in FIG. 3 by using the sliding assembly 4. In this case, no heat dissipation channel is formed between the bottom shell 1 and the lifting shell 2. When the user needs to dissipate heat for the heat emitting component 12 in the bottom shell 1, the user may enable the housing structure to be in the open state in FIG. 2 by using the sliding assembly 4. In this case, the heat dissipation channel 3 is formed between the bottom shell 1 and the lifting shell 2. Therefore, in this embodiment of this application, the housing structure may be enabled to be in the open state or the closed state by using the sliding assembly 4, so that the housing structure provided in this embodiment of this application has higher flexibility.

Figure 4:
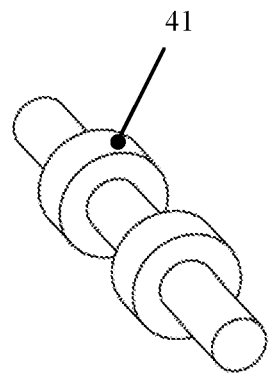
FIG. 4 is a schematic diagram of a sliding shaft of a sliding assembly according to an embodiment of this application.
Figure 5:
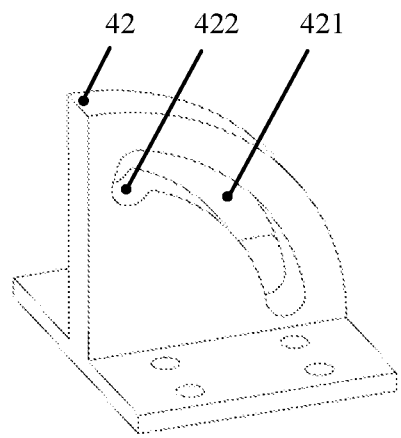
FIG. 5 is a schematic diagram of a sliding mechanical part of a sliding assembly according to an embodiment of this application.
Figure 6:
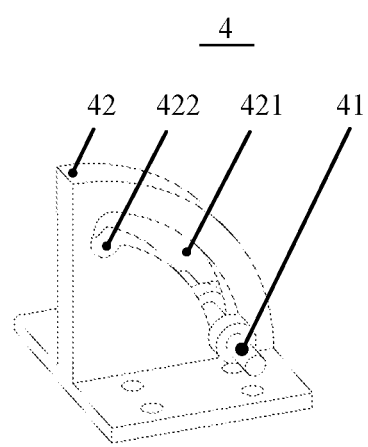
FIG. 6 is a schematic diagram of a sliding assembly in a first state according to an embodiment of this application.
Figure 7:
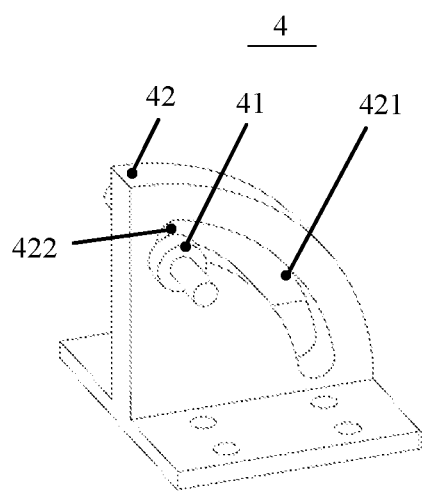
FIG. 7 is a schematic diagram of a sliding assembly in a second state according to an embodiment of this application.

FIG. 4 is a schematic diagram of a sliding shaft of the sliding assembly according to an embodiment of this application, FIG. 5 is a schematic diagram of a sliding mechanical part of the sliding assembly according to an embodiment of this application, FIG. 6 is a schematic diagram of the sliding assembly in a first state according to an embodiment of this application, and FIG. 7 is a schematic diagram of the sliding assembly in a second state according to an embodiment of this application.

In the embodiments shown in FIG. 2 to FIG. 7, the sliding assembly 4 of the housing structure includes the sliding shaft 41 and the sliding mechanical part 42. The sliding shaft 41 is disposed at the second end of the bottom shell 1, and the sliding mechanical part 42 is disposed at the second end of the lifting shell 2. A sliding slot 421 and a blocking slot 422 that are connected to each other are disposed on the sliding mechanical part 42. The sliding shaft 41 adapts to the sliding slot 421 and the blocking slot 422, that is, the sliding shaft 41 may slide in the sliding slot 421, and the sliding shaft 41 may be fixed in the blocking slot 422. When the sliding shaft 41 slides in the sliding slot 421 to the blocking slot 422 on the sliding mechanical part 42, the second end of the lifting shell 2 and the second end of the bottom shell 1 are spaced by the first distance h, and the second end of the lifting shell 2 is fixedly connected to the second end of the bottom shell 1 by using the sliding shaft 41 and the blocking slot 422. In this case, the sliding assembly 4 is in the state in FIG. 2. In other words, the housing structure is in the open state. Certainly, the user may apply external force to enable the sliding shaft 41 to leave the blocking slot 422 and enter the sliding slot 421.

In the embodiments shown in FIG. 2 to FIG. 7, the sliding shaft 41 of the sliding assembly 4 shown in FIG. 2 is fixed in the blocking slot 422, and the sliding shaft 41 of the sliding assembly 4 shown in FIG. 7 is also fixed in the blocking slot 422. The sliding shaft 41 of the sliding assembly 4 shown in FIG. 3 is in the sliding slot 421, and the sliding shaft 41 of the sliding assembly 4 shown in FIG. 6 is also in the sliding slot 421.

In the embodiments shown in FIG. 2 to FIG. 7, a groove (not shown in the figure) for accommodating the lifting shell 2 may be further disposed on the bottom shell 1. When the user does not need to dissipate heat for the heat emitting component 12 in the bottom shell 1, the user may enable the housing structure to be in the closed state in FIG. 3 by using the sliding assembly 4. In this case, no heat dissipation channel is formed between the bottom shell 1 and the lifting shell 2, and the lifting shell 2 may be accommodated in the groove on the bottom shell 1, to save space for placing the housing structure.

In the embodiments shown in FIG. 2 to FIG. 7, the housing structure having the sliding assembly 4 is provided. Certainly, the housing structure may alternatively have another form, and is not limited to the embodiments shown in FIG. 2 to FIG. 7.

For example, in an implementable solution, the housing structure includes the bottom shell and the lifting shell. The first end of the bottom shell may be alternatively fixedly connected to the first end of the lifting shell, the second end of the bottom shell and the second end of the lifting shell are spaced by the first distance, and the space between the bottom shell and the lifting shell forms the heat dissipation channel. The heat dissipation panel is disposed on the bottom shell, the first surface of the heat dissipation panel is in contact with the heat emitting component, and the second surface of the heat dissipation panel is located in the heat dissipation channel. In this solution, although the lifting shell cannot be accommodated in the bottom shell, heat dissipation can also be better performed for the heat emitting component in the bottom shell.

Figure 8:
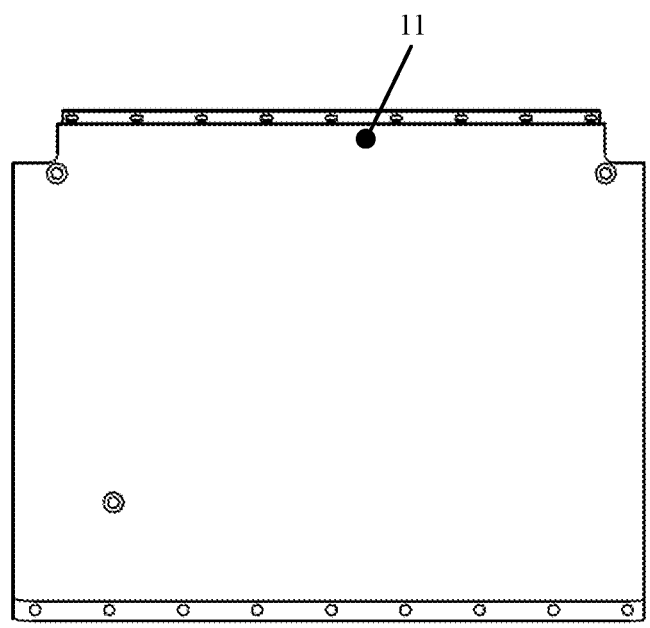
FIG. 8 is a schematic diagram of a heat dissipation panel according to an embodiment of this application.
Figure 9:
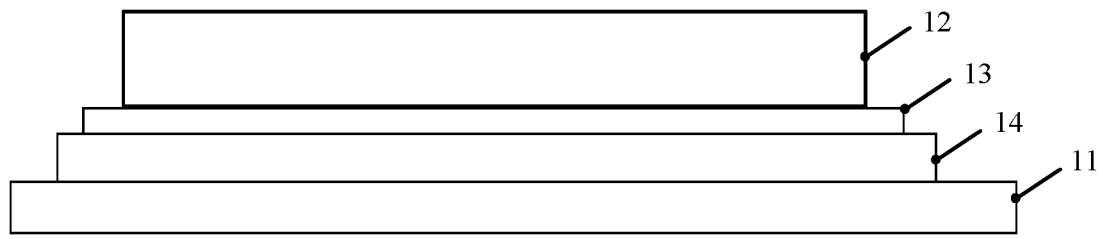
FIG. 9 is a schematic diagram of a heat dissipation panel, a heat conducting material, a heat pipe, and a heat emitting component according to an embodiment of this application.

FIG. 8 is a schematic diagram of the heat dissipation panel according to an embodiment of this application, and FIG. 9 is a schematic diagram of the heat dissipation panel, a heat conducting material, a heat pipe, and the heat emitting component according to an embodiment of this application. In the embodiments shown in FIG. 8 and FIG. 9, the heat conducting material 13 and the heat pipe 14 are further disposed on the first surface of the heat dissipation panel 11, and the first surface of the heat dissipation panel 11 is in contact with the heat emitting component 12 by using the heat conducting material 13 and the heat pipe 14.

In the embodiments shown in FIG. 8 and FIG. 9, because the heat conducting material 13 and the heat pipe 14 have better heat conducting property, the heat conducting material 13 and the heat pipe 14 can better transfer heat on the heat emitting component 12 to the heat dissipation panel 11, so that the heat dissipation panel 11 can more quickly transfer heat to the external environment.

Figure 10:
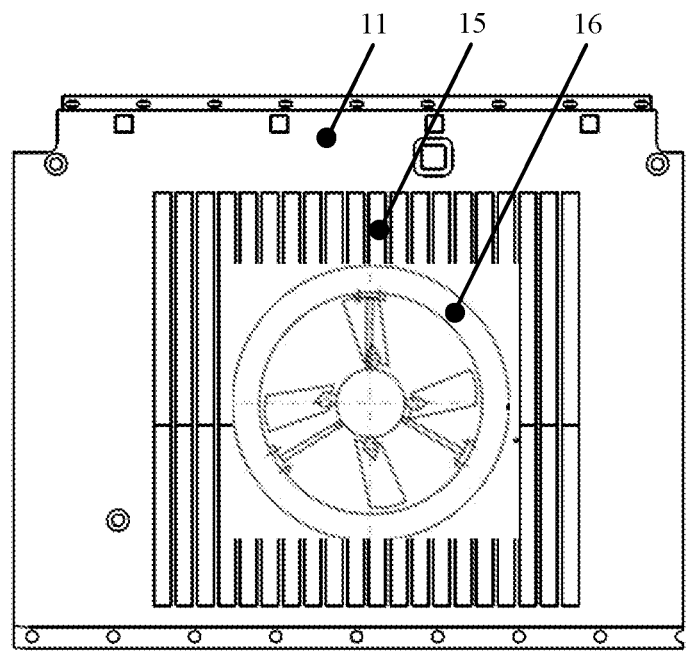
FIG. 10 is a schematic diagram of another heat dissipation panel according to an embodiment of this application.
Figure 11:
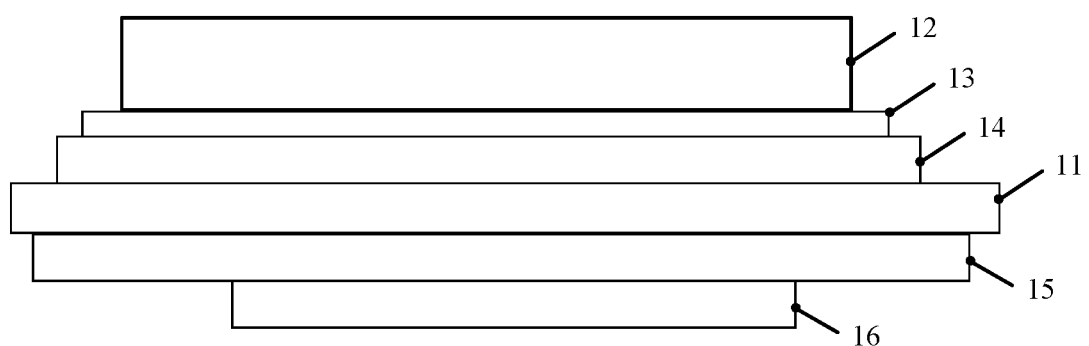
FIG. 11 is a schematic diagram of a heat dissipation panel, a heat conducting material, a heat pipe, a heat emitting component, a heat dissipation fin, and a heat dissipation fan according to an embodiment of this application.

FIG. 10 is a schematic diagram of another heat dissipation panel according to an embodiment of this application, and FIG. 11 is a schematic diagram of the heat dissipation panel, a heat conducting material, a heat pipe, a heat emitting component, a heat dissipation fin, and a heat dissipation fan according to an embodiment of this application. In the embodiments shown in FIG. 10 and FIG. 11, the heat conducting material 13 and the heat pipe 14 are disposed on the first surface of the heat dissipation panel 11, and the first surface of the heat dissipation panel 11 is in contact with the heat emitting component 12 by using the heat conducting material 13 and the heat pipe 14. A heat dissipation fin 15 is further disposed on the second surface of the heat dissipation panel 11, and a heat dissipation fan 16 is further disposed on the heat dissipation fin 15 on the second surface of the heat dissipation panel 11.

In the embodiments shown in FIG. 10 and FIG. 11, the heat dissipation fin 15 is disposed on the second surface of the heat dissipation panel 11. The heat dissipation fin 15 increases a heat dissipation area of the heat dissipation panel 11, and the heat dissipation fin 15 can quickly transfer heat on the heat dissipation panel 11 to the external environment. In addition, the heat dissipation fan 16 can blow cold air from the external environment to the heat dissipation fin 15, so that heat on the heat dissipation fin 15 is dissipated more quickly.

In the embodiments shown in FIG. 10 and FIG. 11, at least one air vent (not shown in the figure) may be further disposed on the heat dissipation panel 11, and the air vent disposed on the heat dissipation panel 11 can also quickly transfer heat on the heat dissipation panel 11 to the external environment.

Figure 12:
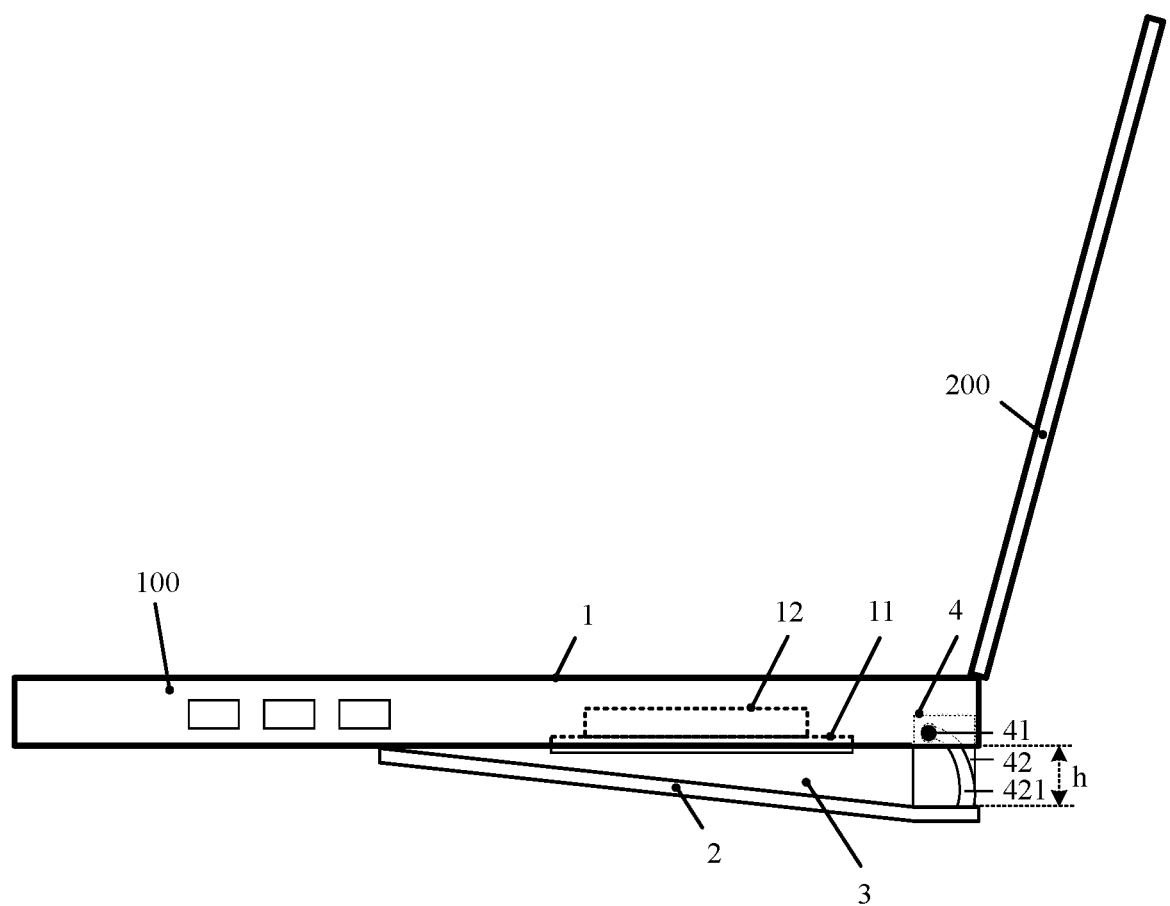
FIG. 12 is a schematic diagram of a terminal device according to an embodiment of this application.

FIG. 12 is a schematic diagram of a terminal device according to an embodiment of this application. The terminal device in FIG. 12 includes a housing structure 100 and a display screen 200. For detailed descriptions of the housing structure 100 in FIG. 12, refer to detailed descriptions of the housing structure in the embodiments shown in FIG. 1 to FIG. 11. In the embodiment shown in FIG. 12, the terminal device shown in FIG. 12 may be a device such as a notebook computer.

What is claimed is:

1. A housing structure, comprising:
a bottom shell;
a sliding assembly; and
a lifting shell,
wherein:
a first end of the bottom shell is connected to a first end of the lifting shell, a second end of the bottom shell and a second end of the lifting shell are spaced by a first distance, and space between the bottom shell and the lifting shell forms a heat dissipation channel;
a heat dissipation panel is disposed on the bottom shell, a first surface of the heat dissipation panel is in contact with a heat emitting component, and a second surface of the heat dissipation panel is located in the heat dissipation channel;
the first end of the bottom shell and the first end of the lifting shell are hinged, and the second end of the bottom shell is connected to the second end of the lifting shell by using the sliding assembly;
when the second end of the lifting shell and the second end of the bottom shell move relative to each other by using the sliding assembly the second end of the lifting shell and the second end of the bottom shell are spaced by the first distance, and the second end of the lifting shell and the second end of the bottom shell are fixedly connected by using the sliding assembly;
the sliding assembly comprises a sliding shaft and a sliding mechanical part, the sliding shaft is disposed at the second end of the bottom shell, and the sliding mechanical part is disposed at the second end of the lifting shell;
a sliding slot and a blocking slot that are connected to each other are disposed on the sliding mechanical part, and the sliding shaft adapts to the sliding slot and the blocking slot; and
when the sliding shaft slides in the sliding slot to the blocking slot on the sliding mechanical part, the second end of the lifting shell and the second end of the bottom shell are spaced by the first distance, and the second end of the lifting shell is fixedly connected to the second end of the bottom shell by using the sliding shaft and the blocking slot.

2. The housing structure according to claim 1, wherein a groove for accommodating the lifting shell is disposed on the bottom shell.

3. The housing structure according to claim 1, wherein the first end of the bottom shell is fixedly connected to the first end of the lifting shell.

4. The housing structure according to claim 3, wherein:
a heat conducting material and a heat pipe are further disposed on the first surface of the heat dissipation panel; and
the first surface of the heat dissipation panel is in contact with the heat emitting component by using the heat conducting material and the heat pipe.

5. The housing structure according to claim 1, wherein a heat dissipation fin is further disposed on the second surface of the heat dissipation panel.

6. The housing structure according to claim 5, wherein a heat dissipation fan is further disposed on the heat dissipation fin on the second surface of the heat dissipation panel.

7. The housing structure according to claim 6, wherein at least one air vent is disposed on the heat dissipation panel.

8. A terminal device, comprising a housing structure, wherein:
the housing structure, comprising a bottom shell, a sliding assembly, and a lifting shell;
a first end of the bottom shell is connected to a first end of the lifting shell, a second end of the bottom shell and a second end of the lifting shell are spaced by a first distance, and space between the bottom shell and the lifting shell forms a heat dissipation channel;
a heat dissipation panel is disposed on the bottom shell, a first surface of the heat dissipation panel is in contact with a heat emitting component, and a second surface of the heat dissipation panel is located in the heat dissipation channel;
the first end of the bottom shell and the first end of the lifting shell are hinged, and the second end of the bottom shell is connected to the second end of the lifting shell by using the sliding assembly;
when the second end of the lifting shell and the second end of the bottom shell move relative to each other by using the sliding assembly the second end of the lifting shell and the second end of the bottom shell are spaced by the first distance, and the second end of the lifting shell and the second end of the bottom shell are fixedly connected by using the sliding assembly;
the sliding assembly comprises a sliding shaft and a sliding mechanical part, the sliding shaft is disposed at the second end of the bottom shell, and the sliding mechanical part is disposed at the second end of the lifting shell;
a sliding slot and a blocking slot that are connected to each other are disposed on the sliding mechanical part, and the sliding shaft adapts to the sliding slot and the blocking slot; and
when the sliding shaft slides in the sliding slot to the blocking slot on the sliding mechanical part, the second end of the lifting shell and the second end of the bottom shell are spaced by the first distance, and the second end of the lifting shell is fixedly connected to the second end of the bottom shell by using the sliding shaft and the blocking slot.

9. The terminal device according to claim 8, wherein a groove for accommodating the lifting shell is disposed on the bottom shell.

10. The terminal device according to claim 8, wherein the first end of the bottom shell is fixedly connected to the first end of the lifting shell.

11. The terminal device according to claim 8, wherein:
a heat conducting material and a heat pipe are further disposed on the first surface of the heat dissipation panel; and
the first surface of the heat dissipation panel is in contact with the heat emitting component by using the heat conducting material and the heat pipe.

12. The terminal device according to claim 8, wherein a heat dissipation fin is further disposed on the second surface of the heat dissipation panel.

13. The terminal device according to claim 12, wherein a heat dissipation fan is further disposed on the heat dissipation fin on the second surface of the heat dissipation panel.

14. The terminal device according to claim 13, wherein at least one air vent is disposed on the heat dissipation panel.

* * * * *

UNITED STATES PATENT AND TRADEMARK OFFICE
CERTIFICATE OF CORRECTION

| | |
|---|---|
| PATENT NO. | : 11,630,494 B2 |
| APPLICATION NO. | : 17/418646 |
| DATED | : April 18, 2023 |
| INVENTOR(S) | : Huang et al. |

It is certified that error appears in the above-identified patent and that said Letters Patent is hereby corrected as shown below:

On the Title Page

Applicant (71): "HONOR DEVICE CO., LTD., Guangdong (CN)" should read -- HONOR DEVICE CO., LTD., Shenzhen (CN) --.

Inventors (72): "Hua Huang, Guangdong (CN)" should read -- Hua Huang, Shenzhen (CN) --.

Inventors (72): "Jun Yang, Guangdong (CN)" should read -- Jun Yang, Shenzhen (CN) --.

Inventors (72): "Zhiguo Zhang, Guangdong (CN)" should read -- Zhiguo Zhang, Shenzhen (CN) --.

Inventors (72): "Haitao Zhen, Guangdong (CN)" should read -- Haitao Zhen, Shenzhen (CN) --.

Signed and Sealed this
Thirtieth Day of May, 2023

Katherine Kelly Vidal
*Director of the United States Patent and Trademark Office*